United States Patent
Kao et al.

(10) Patent No.: US 9,572,275 B2
(45) Date of Patent: Feb. 14, 2017

(54) EXPANDABLE SERVER CASE

(71) Applicant: Super Micro Computer Inc., San Jose, CA (US)

(72) Inventors: Chi-Fu Kao, San Jose, CA (US); Ruei-Fu Weng, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 210 days.

(21) Appl. No.: 14/493,351

(22) Filed: Sep. 23, 2014

(65) Prior Publication Data

US 2015/0282375 A1   Oct. 1, 2015

(30) Foreign Application Priority Data

Mar. 31, 2014 (TW) .............................. 103205496 U

(51) Int. Cl.
*H05K 1/14*     (2006.01)
*H05K 7/14*     (2006.01)

(52) U.S. Cl.
CPC .................................. *H05K 7/1487* (2013.01)

(58) Field of Classification Search
None
See application file for complete search history.

(56) References Cited

U.S. PATENT DOCUMENTS

| | | | | |
|---|---|---|---|---|
| 4,553,674 A * | 11/1985 | Yoshikawa | .......... | H05K 7/1425 211/189 |
| 5,680,294 A * | 10/1997 | Stora | .................... | H05K 7/1457 361/695 |
| 7,199,491 B2 * | 4/2007 | Novinsky | ............ | H02B 11/173 307/328 |
| 7,613,006 B2 * | 11/2009 | Kuo | ...................... | G11B 33/123 174/520 |
| 7,894,193 B2 * | 2/2011 | Lai | .......................... | G06F 1/188 312/223.2 |
| 8,824,149 B2 * | 9/2014 | Wang | ...................... | G06F 1/188 361/272 |
| 2003/0039099 A1 * | 2/2003 | Chen | ....................... | G06F 1/181 361/727 |
| 2003/0161108 A1 * | 8/2003 | Bright | .................. | G02B 6/4201 361/707 |
| 2005/0195075 A1 * | 9/2005 | McGraw | .................... | G06F 1/18 340/500 |
| 2006/0250777 A1 * | 11/2006 | Chen | ......................... | G06F 1/26 361/727 |
| 2009/0147459 A1 * | 6/2009 | Nguyen | .................. | G06F 1/188 361/679.31 |
| 2010/0018738 A1 * | 1/2010 | Chen | .................... | H05K 9/0058 174/51 |

(Continued)

*Primary Examiner* — Xanthia C Cunningham
(74) *Attorney, Agent, or Firm* — Chun-Ming Shih; HDLS IPR Services

(57) ABSTRACT

An expandable server case includes a shell and an expansion frame. The shell includes at least one docking space. The expansion frame is detachably assembled on one end of the shell and protruding from the periphery of the shell. The expansion frame is disposed corresponding to the docking space, and one side of the expansion frame is provided with a junction which is capable of fastening the power supply device. The power supply device is able to be inserted into the docking space to partially be accommodated into the expansion frame and is positioned onto the junction.

9 Claims, 6 Drawing Sheets

(56) References Cited

U.S. PATENT DOCUMENTS

| | | | | |
|---|---|---|---|---|
| 2010/0027211 A1* | 2/2010 | Wu | ............................ | G06F 1/18 |
| | | | | 361/679.33 |
| 2011/0261526 A1* | 10/2011 | Atkins | ..................... | G06F 1/187 |
| | | | | 361/679.33 |
| 2012/0162868 A1* | 6/2012 | Liu | ......................... | G06F 1/187 |
| | | | | 361/679.01 |
| 2012/0194350 A1* | 8/2012 | Crisp | .................... | H05K 7/1498 |
| | | | | 340/815.42 |
| 2012/0257352 A1* | 10/2012 | Liu | ......................... | G06F 1/188 |
| | | | | 361/695 |
| 2012/0293975 A1* | 11/2012 | Liang | ...................... | G06F 1/188 |
| | | | | 361/807 |
| 2013/0072070 A1* | 3/2013 | Tsai | ........................ | G06F 1/189 |
| | | | | 439/660 |
| 2013/0094156 A1* | 4/2013 | Wang | ...................... | G06F 1/188 |
| | | | | 361/747 |
| 2013/0170150 A1* | 7/2013 | Wang | ................... | H05K 7/1412 |
| | | | | 361/747 |
| 2013/0220952 A1* | 8/2013 | Zhou | ..................... | G11B 33/128 |
| | | | | 211/26 |
| 2013/0279123 A1* | 10/2013 | Lin | ....................... | H05K 9/0018 |
| | | | | 361/747 |
| 2013/0342979 A1* | 12/2013 | Chen | ......................... | H02J 1/00 |
| | | | | 361/679.01 |
| 2014/0015386 A1* | 1/2014 | Liu | ........................... | H05K 5/04 |
| | | | | 312/223.1 |
| 2015/0049429 A1* | 2/2015 | Zhu | ......................... | G06F 1/187 |
| | | | | 361/679.39 |
| 2015/0195946 A1* | 7/2015 | Kelaher | ............... | H05K 7/1488 |
| | | | | 312/244 |
| 2015/0223349 A1* | 8/2015 | Briant | .................. | H05K 5/0013 |
| | | | | 361/737 |

* cited by examiner

EXPANDABLE SERVER CASE

BACKGROUND

1. Technical Field

The present invention relates to a server, particularly to a case assembling structure of a server system.

2. Related Art

Due to large amount of electronic data access requirements, nowadays most of the enterprises are equipped with a server system for storing the electronic data in a place to provide users with easy access to the information they need and convenience to backup and protect data.

Conventional server systems are mainly installed electronic devices in the case, such as motherboard, power supply, etc. The interior of the case is usually divided into several docking spaces for accommodating a plurality of hard disks arranged in array. However, under different conditions and different system demands, the server system usually needs to install a power supply with a corresponding power and size, creating multiple case sizes and specifications for the server system. On the other hand, when the using demand is changed, the interior of the case needs to install a power supply or hard disk with different standard, making the size of the case no longer match the requirement. Thus, purchasing another case is needed, which significantly increases the cost and causes inconvenience for the user.

BRIEF SUMMARY

The present invention provides an expandable server case, and the expansion frame is selectively assembled onto the shell to achieve the goal of flexible using. By this arrangement, the server case can accommodate many power supply devices with different specifications, therefore lowering the installation cost of the server case.

The present invention is an expandable server case, which is used to accommodate the power supply device. The expandable server case includes a shell and an expansion frame. The shell includes at least one docking space used for accommodating the power supply device; the expansion frame is detachably assembled on one end of the shell and protrudes from the periphery of the shell, the expansion frame is disposed corresponding to the docking space, and one side of the expansion frame is provided with at least one junction which is capable of fastening the power supply device. The power supply device can be inserted into the docking space to partially be accommodated into the expansion frame and positioned onto the junction.

Compared to the conventional technique, the server case according to the present invention includes an expansion frame, and the expansion frame is disposed corresponding to the docking space in the shell. When the user wants to change the specifications of the power supply device, and the length of the power supply device with a specification is longer than the original power supply device, the expansion frame can be assembled on the outer periphery of the shell to expand the length of the docking space, thereby accommodating the power supply device better than the original docking space. The expandable frame provides a flexible using function to the user, and also solves the problem of replacing the whole shell when changing the power supply device. By this arrangement, the cost of replacing power supply device can be reduced, and the practicality of the server case can be improved significantly.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
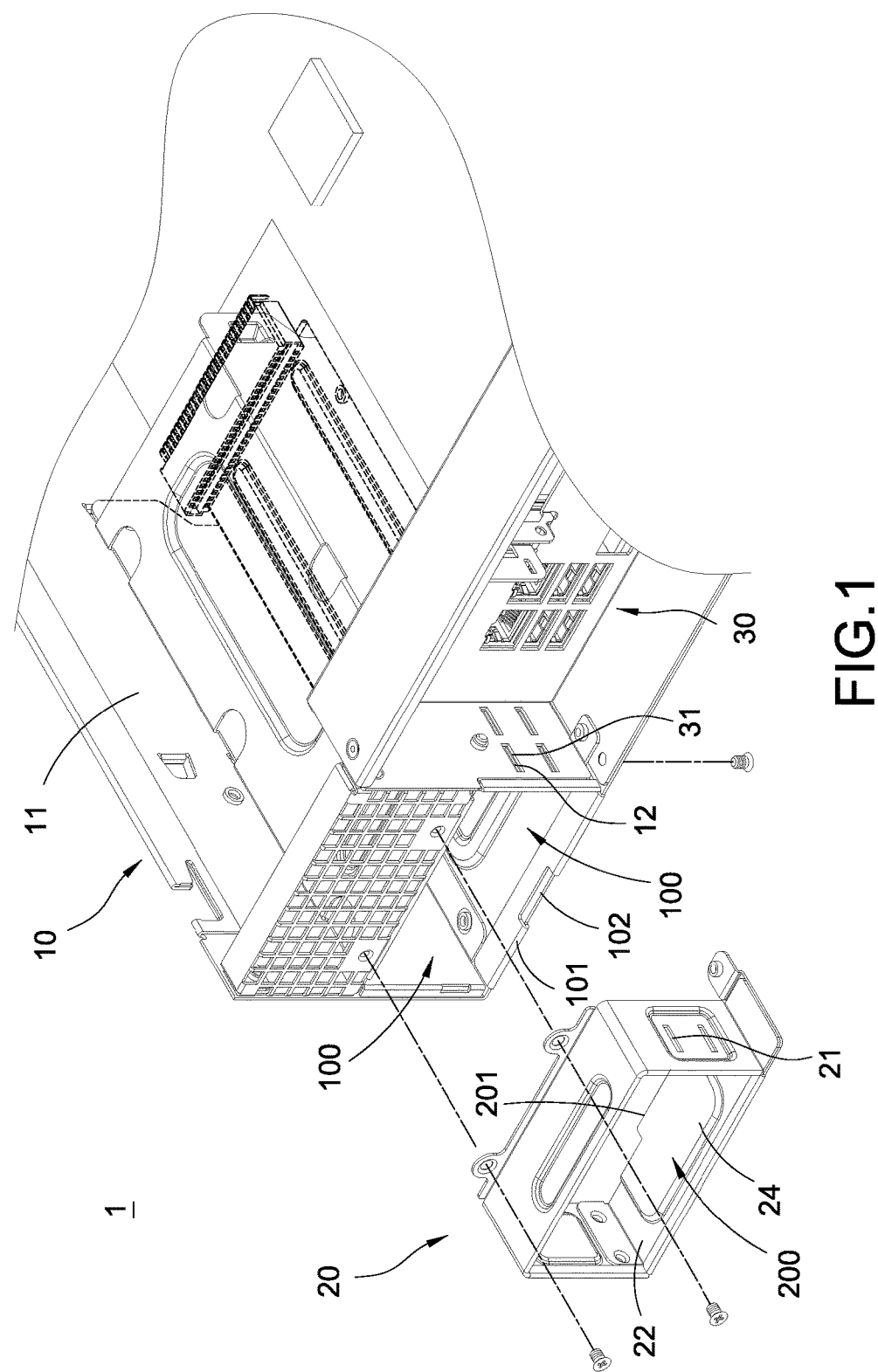
FIG. 1 is a partial perspective view of the expandable server case according to the present invention.
Figure 2:
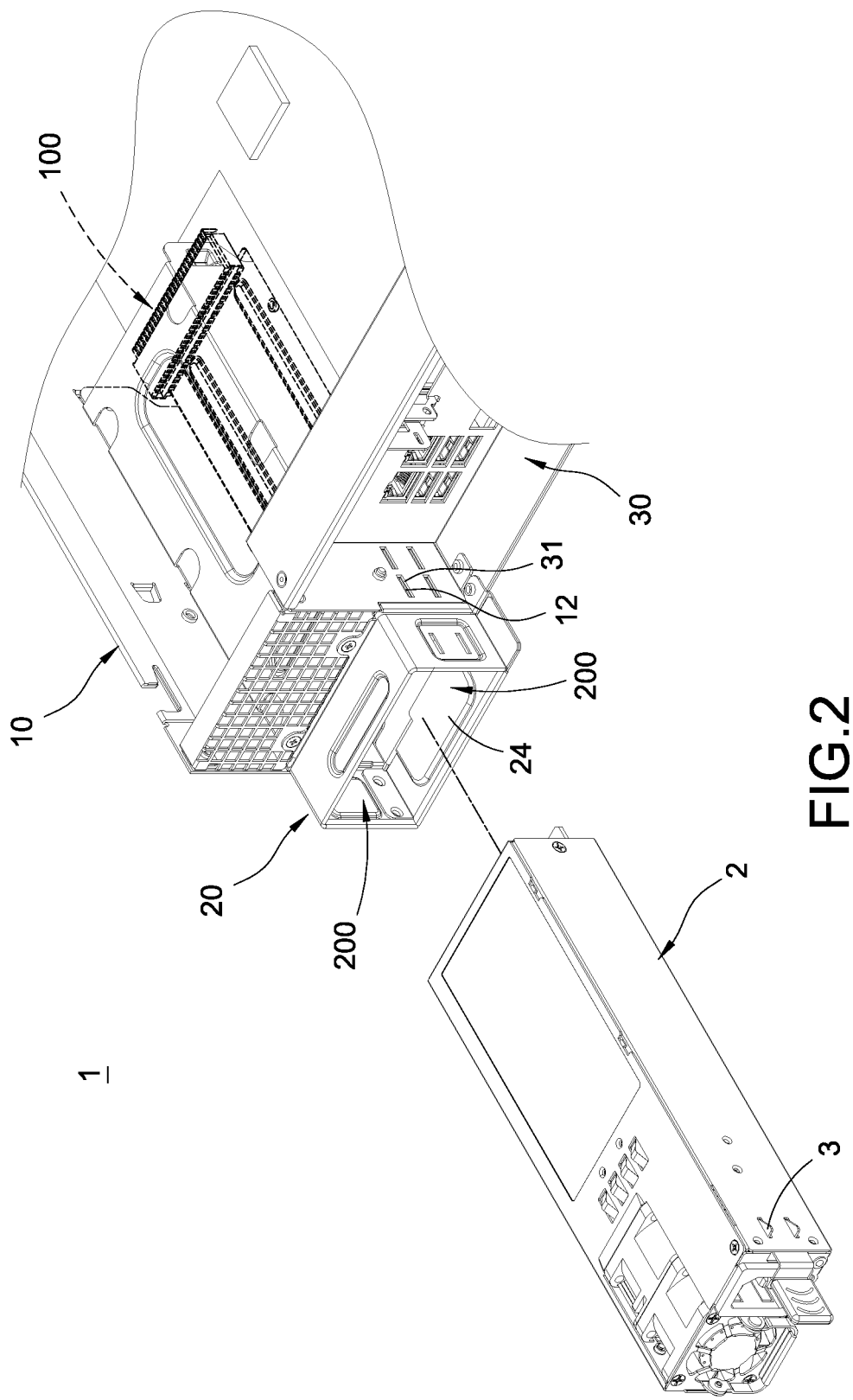
FIG. 2 is a power supply plugging schematic view of the expandable server case according to the present invention.

Please refer to FIGS. 1 and 2. The expandable server case 1 according to the present invention includes a shell 10 and an expansion frame 20. The expansion frame 20 can be optionally used, and the user can optionally assemble the expansion frame 20 onto the shell 10 as needed.

The shell 10 is a rectangular frame composed of a plurality of plates 11. By the arrangement of the plurality of plates 11, the shell 10 includes at least one docking space 100 accommodating a power supply device 2.

The expansion frame 20 is detachably assembled on one end of the shell 10 and protruding from the periphery 101 of the shell 10. The expansion frame 20 is disposed corresponding to the docking space 100. One side of the expansion frame 20 is provided with at least one junction 21, and the junction 21 is used for positioning the power supply device 2 which is disposed in the docking space 100.

In one preferred embodiment of the present invention, the expansion frame 20 includes a plurality of side plates 22. One side of the plurality of side plates 22 is formed with a junction 21, and the junction 21 can be a buckling groove, but not limited thereto. Moreover, the quantity of the junction 21 can be plural. A plurality of junctions 21 can be disposed in interval, such as upper and lower junctions 21 arranged in interval, or right and left junctions 21 arranged in interval. When the plurality of junctions 21 are arranged vertically from the top to the bottom, the power supply 2 can be positioned more securely. Besides, when the plurality of junctions 21 are arranged horizontally from right to the left, different length of the power supply device 2 can be positioned.

The plurality of side plates 22 are connected to form a rectangular frame, and the plurality of side plates 22 are formed with an expansion space 200 corresponding to the docking space 100. Besides, one side of the plurality of the side plates 22 is formed with a structure reinforcement part 24. The structure reinforcement part 24 is used for reinforcing the structural strength of the expansion frame 20. Preferably, the structure reinforcement part 24 can be a convex surface or a plurality of convex ribs, but not limited thereto.

Moreover, in the present embodiment, a positioning slot 102 is provided on a periphery 101 of a side of the shell 10 where the expansion frame 20 is connected. Relatively, a positioning protrusion plate 201 is formed at a periphery of a side of the expansion frame 20 where the shell 10 is connected. The expansion frame 20 and the shell 10 are positioned by the connecting of the positioning protrusion plate 201 and the positioning slot 102. After the expansion frame 20 and the shell 10 are positioned, the expansion frame 20 can be precisely secured on the shell 10.

In the present embodiment, at least one second junction 12 provided on a side of the shell 10 corresponding to the docking space 100, and the power supply device 2 accommodated in the docking space 100 is positioned by the second junction 12. One side of the power supply device 2 is provided with at least one positioning structure 3, such as buckle. Besides, the quantity of the second junction 12 can be plural, and a plurality of junctions 12 can be vertically or horizontally disposed in interval.

The server case 1 further includes an input/output frame structure 30. The input/output frame structure 30 is provided with at least one third junction 31 at a position corresponding to the second junction 12. As such, when the power supply device 2 with a length no longer than the length of the docking space 100 is accommodated into the docking space 100, the positioning structure 3 of the power supply device 2 can be positioned on the overlapping position of the second junction 12 and the third junction 31.

It is noted that, the expandable server case according to the present invention is mainly used in accommodating the power supply device 2 with longer length than the ordinary one, especially the one exceeds the length of the docking space 100. For example, if the shell 10 can accommodate a power supply device 2 with length of 185 mm or 213 mm, and the power supply device 2 that is accommodated therein is 185 mm or 213 mm, the expansion frame 20 does not need to be assembled onto the shell 10.

On the other hand, if the user changes the specification of the power supply device 2 and wants to install a power supply device 2 with length more than 213 mm, the expansion frame 20 needs to be assembled onto the shell 10. After assembling the expansion frame 20 onto the shell 10, the total length of the server case 1 can be extended, thereby accommodating the power supply device 2 with length longer than 213 mm, such as 233 mm or 265 mm. Moreover, the length of the expansion frame 20 (length toward the insertion direction) can be regulated as needed.

Figure 3:
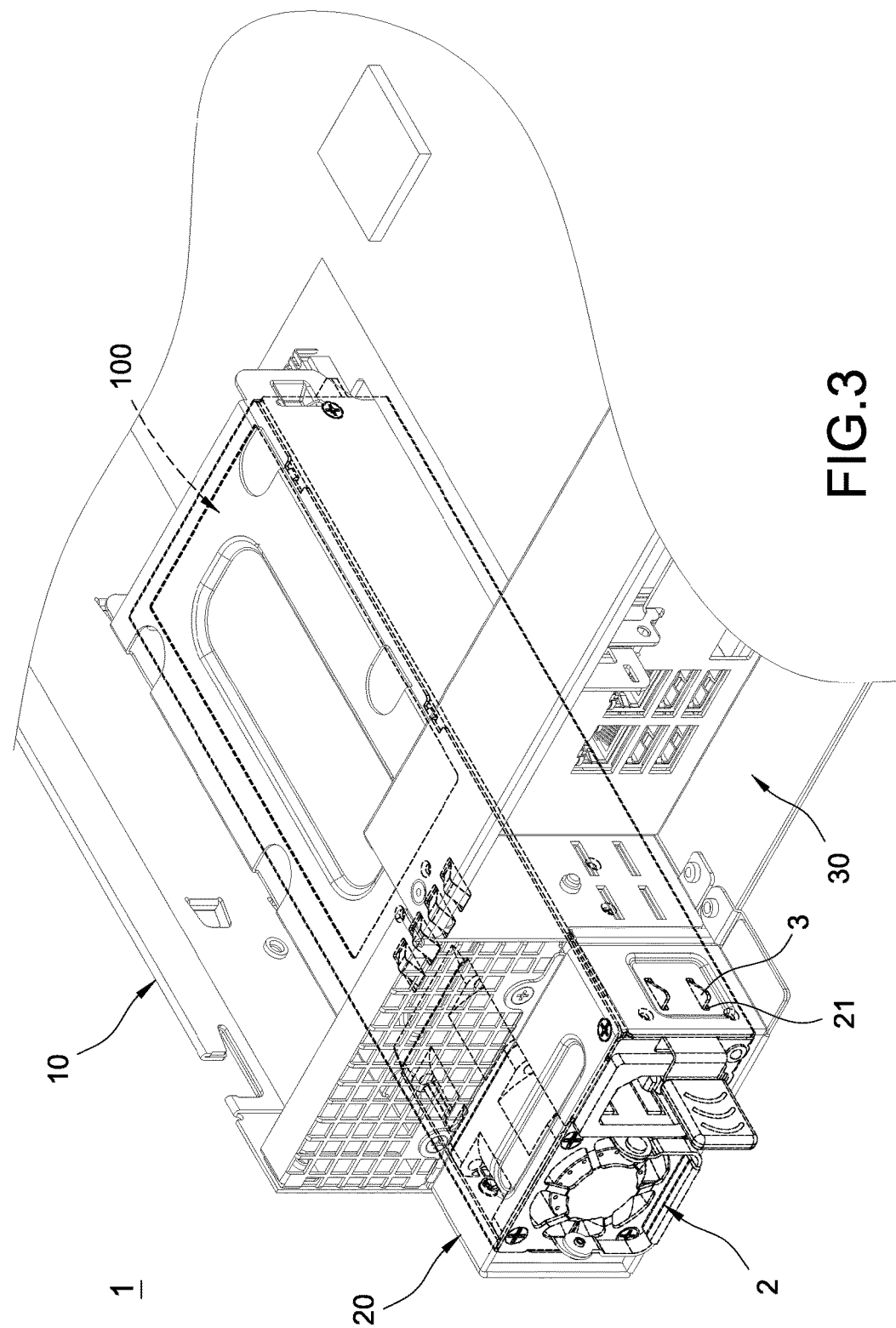
FIG. 3 is a partial perspective view when the power supply is plugged into the expandable server case according to the present invention.

Please refer to FIG. 3. After the expansion frame 20 is assembled onto the shell 10, the power supply device 2 is inserted in the docking space 100. Meanwhile, the power supply device 2 can be inserted into the docking space 100. Part of the power supply device 2 can be accommodated into the expansion frame 20, and the power supply device 2 is positioned onto the junction 21.

It is noteworthy that, the arrangement of the junction 21, the second junction 12, and the third junction 31 are corresponding to the positioning structure 3 of the power supply 2, thereby allowing the positioning structure 3 to be assembled on the junction 21, the second junction 12, and the third junction 31.

Figure 4:
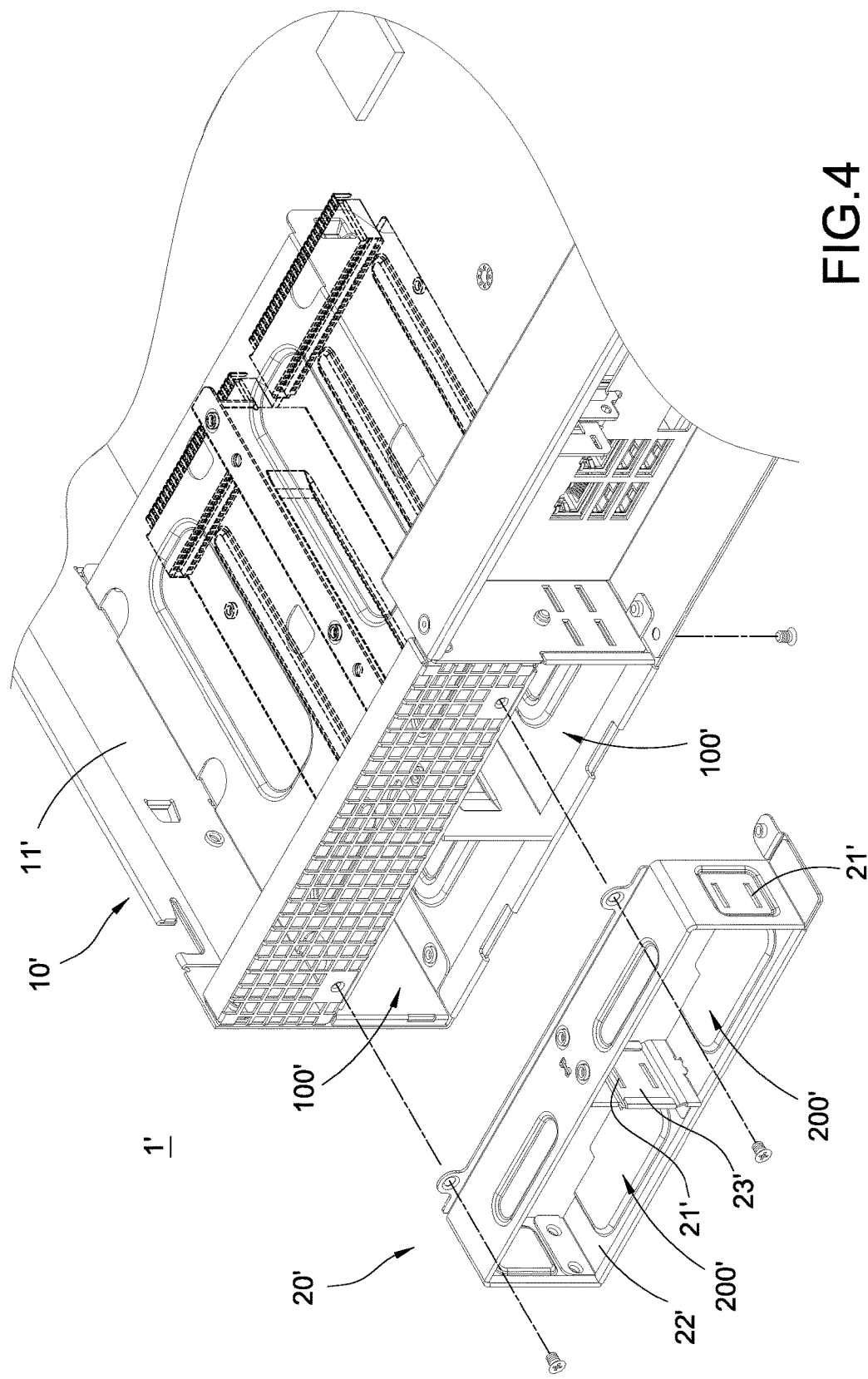
FIG. 4 is another partial perspective view of the expandable server case according to the present invention.
Figure 5:
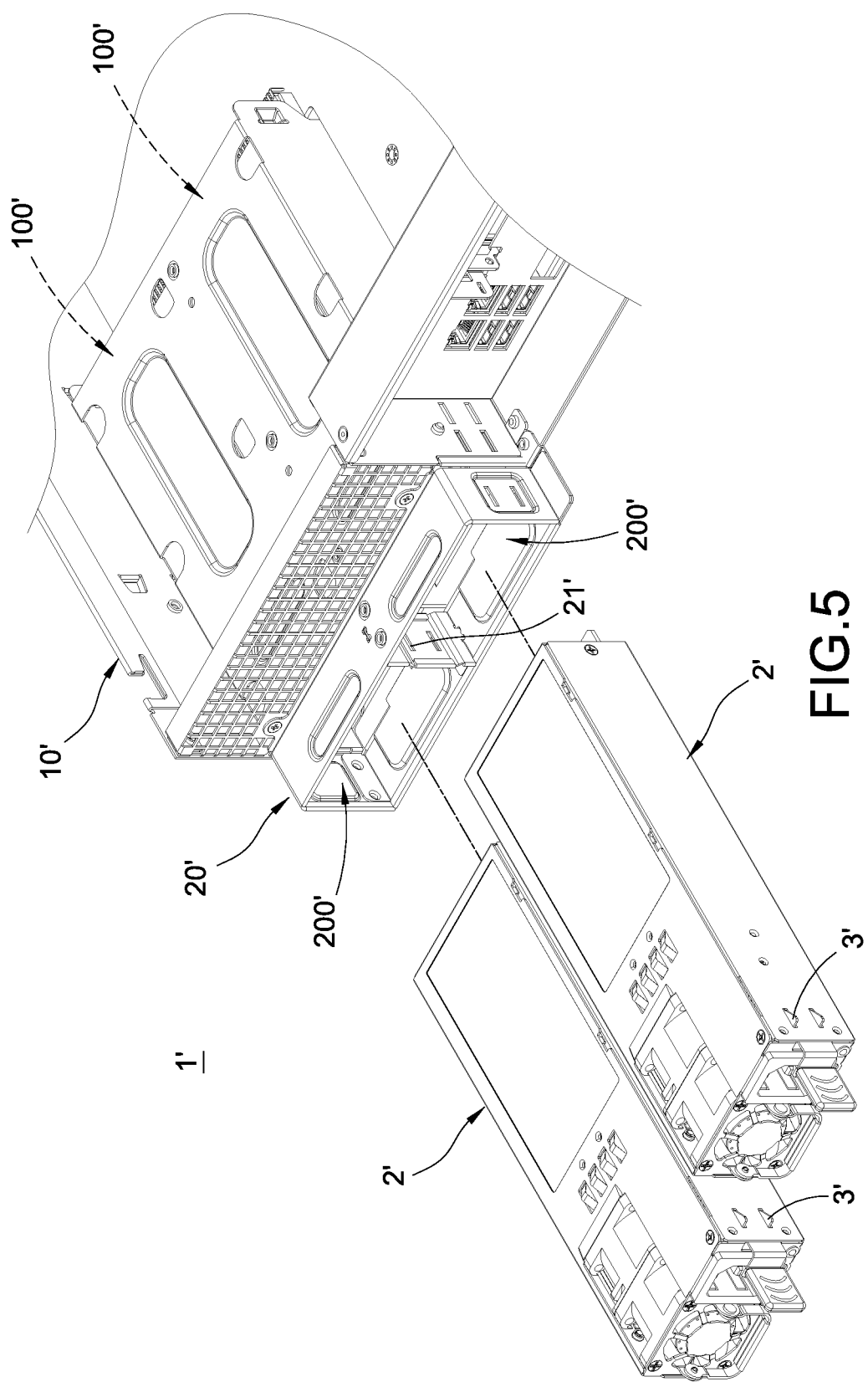
FIG. 5 is another power supply plugging schematic view of the expandable server case according to the present invention.
Figure 6:
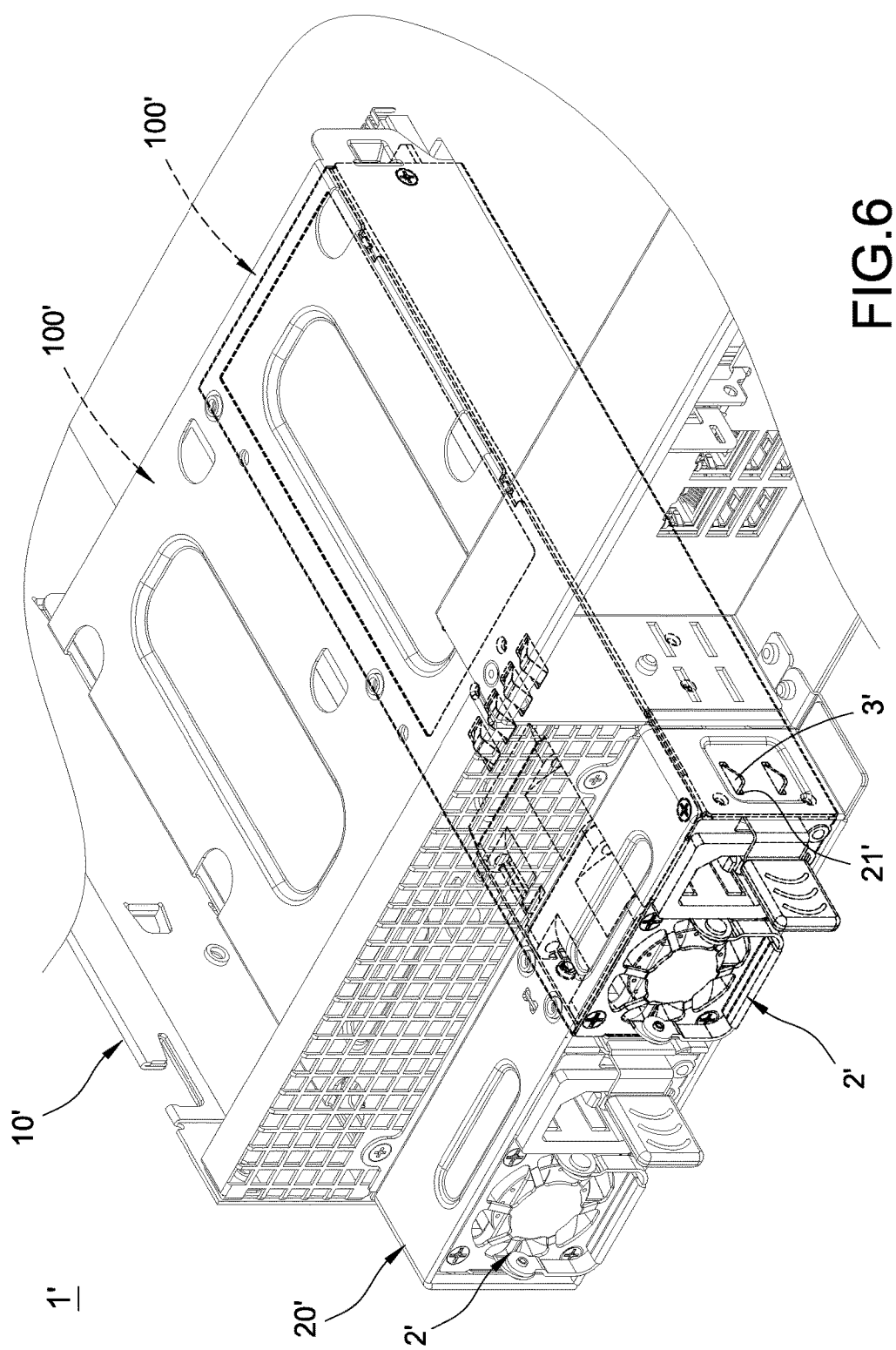
FIG. 6 is another partial perspective view when the power supply is plugged into the expandable server case according to the present invention.

Please refer to FIG. 4 to FIG. 6. The present embodiment is approximately the same as the first embodiment. The expandable server case 1' includes a shell 10' and an expandable frame 20'. The shell 10' is a rectangular frame composed of a plurality of plates 11'. The expansion frame 20' is detachably assembled on one end of the shell 10' and protruding from the shell 10'. One side of the expansion frame 20' is provided with at least one junction 21', and the junction 21' is used for positioning the power supply device 2'.

The difference between the present embodiment and the first embodiment lies in that, the shell 10' includes a plurality of docking spaces 100' used for accommodating a plurality of power supply devices 2'. The expansion frame 20' is disposed corresponding to the plurality of docking spaces 100'. Besides, one side of each of the power supply devices 2' is provided with a positioning structure 3'.

In the present embodiment, the expansion frame 20' includes a plurality of side plates 22' and a partition plate 23'. The plurality of side plates 22' are connected to form a rectangular frame, and the partition plate 23' is connected inside the rectangular frame. The plurality of side plates 22' and the partition plate 23' are corresponding to the plurality of docking spaces 100' which are arranged in interval to divide an interior of the rectangular frame into a plurality of expansion spaces 200'. Besides, the partition plate 23' is also provided with a junction 21' to connect the plurality of power supply devices 2'. The other structure and of the present embodiment is approximately the same as the first embodiment.

What is claimed is:

1. An expandable server case, used for accommodating at least one power supply device, comprising:
    a shell, including at least one docking space used for accommodating the power supply device;
    an expansion frame, detachably assembled on one end of the shell and protruding from the periphery of the shell, the expansion frame being disposed corresponding to the at least one docking space, and one side of the expansion frame being provided with at least one first junction which is capable of fastening the power supply device,
    wherein at least one second junction provided on a side of the shell corresponding to the docking space, and the second junction is capable of fastening the power supply device; and
    an input/output frame structure, wherein the input/output frame structure is provided with at least one third junction at a position corresponding to the second junction, and the power supply device is positioned at a place where the second junction overlaps with the third junction,
    wherein the power supply device is able to be inserted into the docking space to be partially accommodated into the expansion frame and positioned onto the first junction, or to be accommodated into the expansion frame and positioned onto the second and third junctions.

2. The expandable server case according to claim 1, wherein a positioning slot is provided on a periphery of a side of the shell where the expansion frame is connected, and a positioning protrusion plate is formed at a periphery of a side of the expansion frame where the shell is connected, the expansion frame and the shell are positioned by the connecting of the positioning protrusion plate and the positioning slot.

3. The expandable server case according to claim 1, wherein the shell includes a plurality of docking spaces, the expansion frame further includes at least one partition plate, the plurality of side plates are connected to form a rectangular frame, the partition plate is connected inside the rectangular frame, and the plurality of side plates and the partition plate are corresponding to the plurality of docking spaces which are arranged in interval to divide an interior of the rectangular frame into a plurality of expansion spaces.

4. The expandable server case according to claim 1, wherein the expansion frame includes a plurality of side plates, and the plurality of side plates are connected to form a rectangular frame to form an expansion space correspondingly.

5. The expandable server case according to claim 4, wherein one side of the plurality of side plates forms a structure reinforcement part.

6. The expandable server case according to claim 5, wherein the structure reinforcement part is a convex surface.

7. The expandable server case according to claim 1, wherein one side of the plurality of side plates forms a buckling groove.

8. The expandable server case according to claim 1, wherein there are a plurality of first junctions disposed in interval.

9. The expandable server case according to claim 1, wherein there are a plurality of second junctions longitudinally disposed in interval or transversely disposed in interval.

\* \* \* \* \*